United States Patent [19]

Kelley, Jr.

[11] 3,968,432

[45] July 6, 1976

[54] REMOTE VOLTAGE SENSOR FOR POWER SYSTEM REGULATION

[75] Inventor: Fred W. Kelley, Jr., Media, Pa.

[73] Assignee: General Electric Company, Phila., Pa.

[22] Filed: Oct. 9, 1974

[21] Appl. No.: 513,378

Related U.S. Application Data

[62] Division of Ser. No. 406,139, Oct. 12, 1973.

[52] U.S. Cl................................. 324/107; 324/127
[51] Int. Cl.² .................... G01R 19/00; G01R 1/22
[58] Field of Search ............ 324/107, 86, 83 A, 127

[56] References Cited
UNITED STATES PATENTS 3,090,006  5/1963  Lenehan ............................ 324/107

Primary Examiner—R. V. Rolinec
Assistant Examiner—Ernest F. Karlsen
Attorney, Agent, or Firm—J. Wesley Haubner

[57] ABSTRACT

In an alternating current electric power system subject to rapid load voltage regulation as a result of variations in reactive load current, reactive load current compensation is provided by fixed capacitors and inductors in parallel with the load, the inductors being in series with static switches which are phase controlled to continuously maintain the net reactive compensating current substantially equal and opposite to the reactive component of load current. Compensation control determines firing time of the static switches in accordance with the magnitude of reactive load current and regulating means additionally controls firing time to maintain line current and voltage at a selected line location substantially in phase coincidence. A reactive load current sensor and a current angle sensor each utilize a signal voltage representative in phase and magnitude of line-to-neutral voltage at a high voltage "critical bus" location but derived from line-to-line voltage and line current at a remote low voltage system location.

2 Claims, 6 Drawing Figures

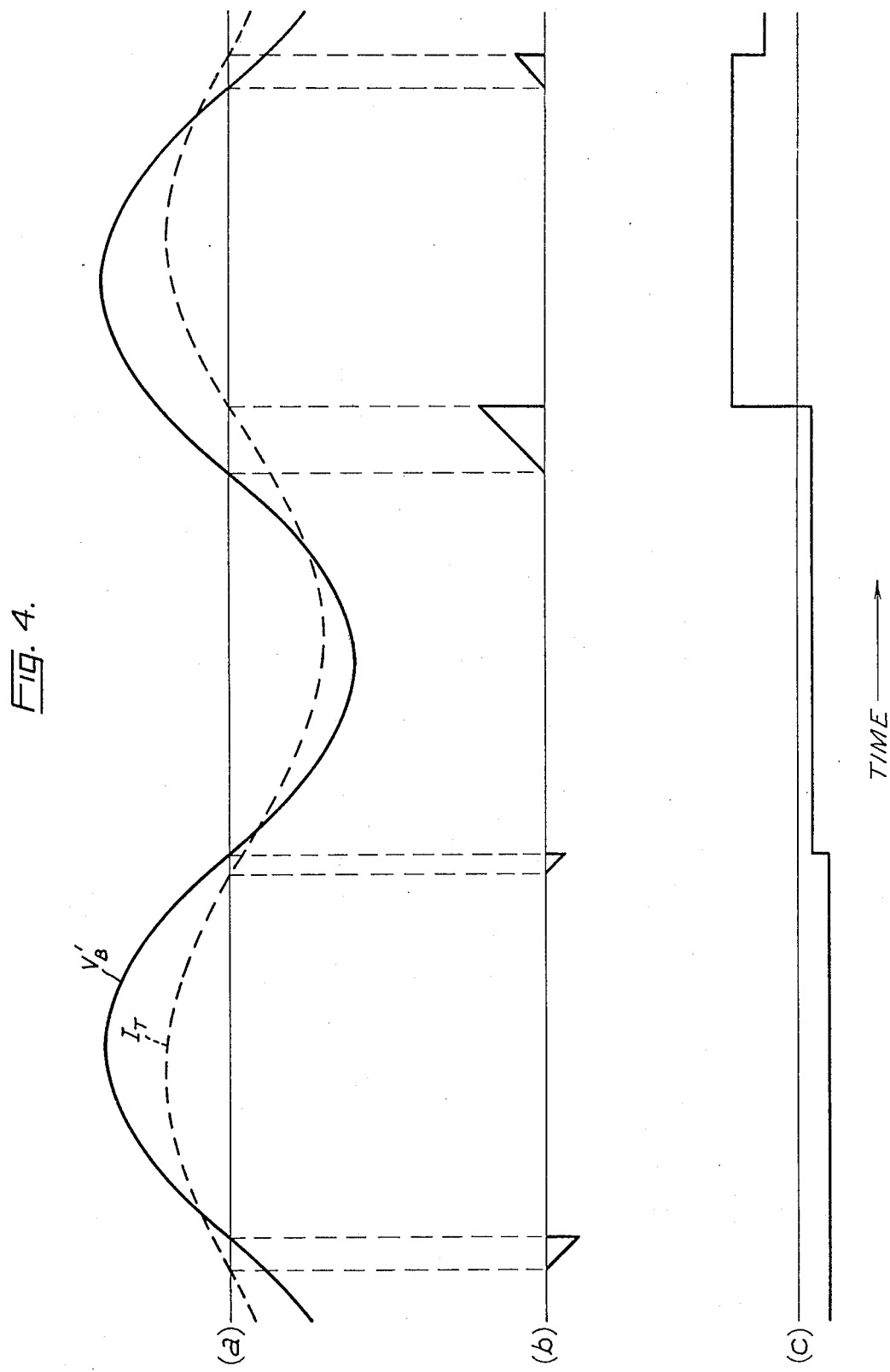

REMOTE VOLTAGE SENSOR FOR POWER SYSTEM REGULATION

This application is a division of application Ser. No. 406,139, filed on Oct. 12, 1973 by Fred W. Kelley, Jr. and Georges R. E. Lezan and assigned to the same assignee as the instant application. No prior art reasonably relevant to the subject matter of this divisional application is presently known to the applicant.

My invention relates to means for measuring alternating voltage at a remote system location, and more particularly to means applicable to a low voltage system location on a three phase power system for measuring, or simulating, line-to-neutral voltage at a remote high voltage location, such as the source side of an interposed power transformer. The invention is especially applicable to regulating systems for stabilization of bus voltage on electric power systems, as where a plurality of load circuits are supplied in parallel from a predetermined "critical bus" location and one or more of the load impedances is highly reactive, variable and erratic.

BACKGROUND

It is known that electric power systems which supply highly reactive loads are characterized by poor voltage regulation, i.e., substantial change in the magnitude of load voltage as load current increases. In a predominantly inductive circuit, voltage magnitude and power factor both decrease as load current increases. To improve system voltage regulation power transformers are commonly provided with tap changers to counteract the tendency of voltage magnitude to change with change in load current. Since most system loads are inductive it is known also to counteract the inductive current components of system load or of particular major loads by connecting compensating capacitance in series with or in shunt across power line conductors. Fixed capacitors may be used where load is reasonably predictable.

With certain variable and erratic major loads, such as arc furnaces, controllable shunt capacitance has been provided by connecting rotating synchronous condensors or static capacitors directly across the load terminals in parallel with the load. The amount of capacitance must be varied as load current changes, for fixed capacitance would have the effect on no load of increasing load terminal voltage above the applied system voltage. The response time of rotating equipment is too slow however to prevent undesirable lamp flicker on the line as a result of large load-induced voltage varations. Similarly, mechanical switching means used for controlling static shunt capacitors does not respond sufficiently rapidly to prevent flicker. While it is known that solid state power switches may be made to respond within less than half a cycle of the power frequency, their use directly in circuit with compensating shunt capacitors is not entirely satisfactory; the leading capacitive current leaves residual charge in the capacitors and as a consequence troublesome transient voltages or harmonic frequencies are generated.

Several arrangements have recently been proposed for varying the net reactive current effect of fixed shunt compensating capacitors by connecting inductors in parallel with the capacitors and varying the amount of reactive current traversing the compensating inductors. This may be done by varying the magnitude of the shunt inductance across each line, as in U.S. Pat. No. 3,551,799-Koppleman, or by varying the amount of reactive current traversing a shunt inductor of fixed magnitude, as in an article "Electric Technology Vol. 1" (1969) pgs. 46–62 published by the Pergamon Press for the Pergamon Institute of New York.

SUMMARY OF INVENTION

In many of the arrangements described above, as well as in other measuring and regulating apparatus, it is desirable to derive from electrical quantities at a measuring location a signal voltage accurately representative of power circuit voltage at a selected remote location. Accordingly, it is a primary object of my invention to provide improved voltage measuring means for deriving from a low voltage system location a voltage signal representative of voltage at a remote regulated system location.

It is a more particular object of my invention to provide an improved voltage measuring circuit for utilizing line voltage and current on the load side of a power transformer for deriving a voltage signal accurately representative of line-to-neutral voltage on the source side of the transformer.

In carrying out my invention in one preferred embodiment I utilize a phase shifting transformer for deriving from phase-to-phase voltage (i.e., line voltage) a voltage signal representative in phase of line-to-neutral voltage, in combination with impedance means for deriving from line current at the load side of a power transformer a voltage drop representative in phase and magnitude of the voltage drop in the power transformer. The invention is described more fully hereinafter in conjunction with reactive current compensating apparatus for quick-acting voltage regulation and flicker control in a power system, a context in which its several objects and advantages may be further appreciated. The invention itself will be more fully understood by referring now to the following description taken in conjunction with the accompanying drawing wherein:

FIG. 1 is a schematic circuit diagram, partially in block form, of reactive current compensating apparatus for an electric power system wherein the reactive current sensor includes remote voltage measuring apparatus embodying our invention, FIG. 2 is a graphical representation of certain electrical characteristics which illustrate the mode of operation of the reactive current sensor shown at FIG. 1, FIG. 3 is a simplified three phase diagram equivalent circuit of a transmission line illustrating means for deriving a projected or simulated voltage signal used in the reactive current control of FIG. 1, and embodying my invention.

FIG. 4 is a graphical representation of certain electrical characteristics which illustrate the mode of operation of the current angle sensor shown at FIG. 1, FIG. 5 is a schematic circuit diagram of the adjustable limit feed-back circuit illustrated in block form at FIG. 1, and FIG. 6 is a graphical representation of reactive load current demand over a selected time interval, illustrating the effect of the limiting feed-back circuit.

DETAILED DESCRIPTION

Power Circuit Components

Figure 1:
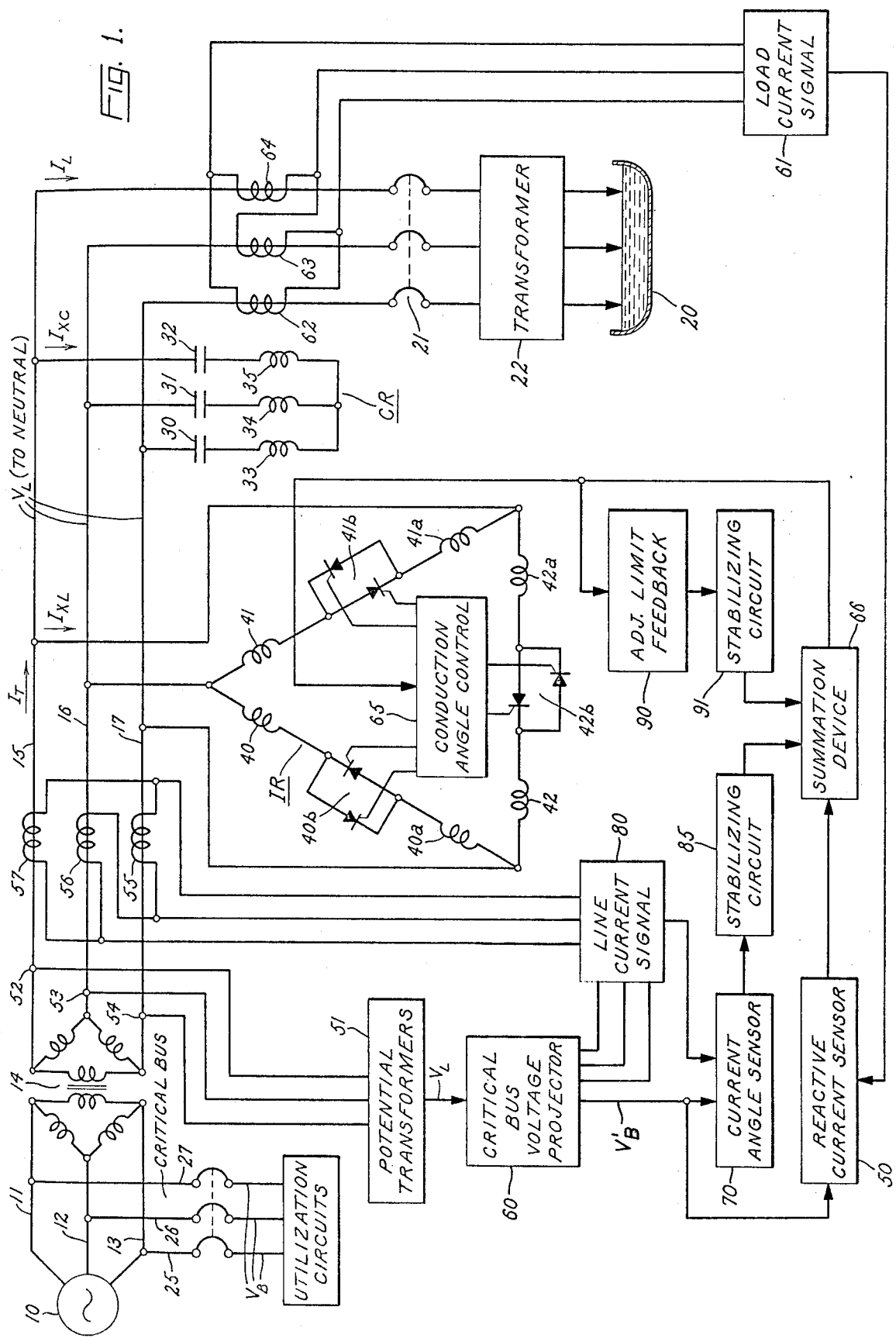

Referring now to the drawing and particularly to FIG. 1 I have illustrated a three phase electric power system comprising a source of voltage, shown as a generator 10, connected to transmission line conductors 11, 12 and 13. In a typical high voltage power system the transmission line voltage may be of the order of 115 KV or 230 KV stepped up from the generator 10 through line transformers not shown. Through a step down transformer 14 the transmission lines 11, 12 and 13 supply power through three bus conductors 15, 16 and 17 to a heavy and erratically variable load illustrated as an electric arc furnace 20. The bus conductors 15, 16 and 17, hereinafter referred to as the furnace bus, may by way of example provide bus voltage of 34.5 KV. Power is supplied to the arc furnace 20 from the furnace bus through a circuit breaker 21 and a step down transformer 22. In practice the arc furnace load 20 may be made up of one or more three phase arc furnaces. Because of the erratic nature of the arcs in such a furnace load current unbalance may at times be severe.

At a selected location on the power system intermediate the generator 10 and the substation transformer 14 a variety of other industrial, commercial and residential load circuits may be connected to the transmission line conductors 11, 12 and 13. By way of illustration such other loads have been designated as "utilization circuits" and are shown connected to the lines 11, 12 and 13 through conductors 25, 26 and 27. It is desirable that voltage upon the conductors 25, 26 and 27 should not vary appreciably in magnitude wth variations in phase or magnitude of the arc furnace load current. The conductors 25, 26 and 27 therefore will be identified as the "critical voltage supply bus" upon which it is desired to eliminate rapid cyclic voltage variation and consequent lamp flicker as consequence of rapid cyclic changes in current and power factor at the arc furnace 20. Line-to-neutral or phase voltage at the critical bus 25, 26, 27 is designated $V_B$ and phase voltage on the arc furnace 15, 16, 17 is designated $V_L$.

While it will be understood by those skilled in the art as the following description proceeds that the reactive current compensating apparatus illustrated is generally applicable to any system of transmission or distribution or to any unique load where it is desired to compensate or counteract reactive current and thus improve power factor, it has particular application to an electric arc furnace load. An electric arc furnace provides a major load of such magnitude and electrical characteristics that it generally produces appreciable low frequency system voltage variation and consequent objectionable lamp flicker in other loads on the system. Such compensating apparatus and my improved signal voltage derivation circuit also have particular application for compensating load variation of drag lines, rolling mill drives and long high voltage transmission lines.

The impedance of an electric arc furnace is comprised primarily of resistance and inductance and this impedance changes abruptly and erratically with changes in the melting and refining conditions in the furnace. Particularly when a new charge of metal scrap is placed in the furnace the arcs experience abrupt and appreciable physical changes over a period of at least several minutes duration until the furnace charge assumes a more or less homogeneous nature. Arcing current is determined to some extent by a counter voltage developed by the arc itself. This counter voltage is of rectangular wave shape and is in phase with the inherently lagging or inductive arc current. The effective impedance of the arc changes abruptly with the arc geometry and in so doing it changes phase relation with respect to the impressed load voltage. Thus to the external circuit an arc furnace load appears as a variable inductance and variable resistance. It is these characteristics which produce rapidly recurrent changes in the phase and magnitude of load voltage with respect to system voltage and consequent low frequency voltage flicker. The frequency of these voltage variations is a characteristic of the furnace parameters and may be of the order of 3 to 6 cycles per second.

To counteract reactive current, particularly inductive current, in the arc furnace load 20 there is provided at FIG. 1 a source of compensating reactive current comprising a bank of three fixed capacitors 30, 31, 32 connected to the furnace bus 15, 16, 17 in wye connected circuit relation through respective tuning inductances 33, 34, 35. In each line-to-neutral arm of the wye-connected capacitor bank the associated inductor is selected to tune the capacitive reactor, herein designated generally as CR, to a selected harmonic of the power system frequency thereby to bypass current of that frequency and filter such currents from the power circuit. Preferably the capacitive reactor CR comprises three separate wye connected banks of fixed capacitors, each bank being tuned to a different harmonic frequency and particularly to the third, fifth and seventh harmonics of the fundamental frequency. These are the predominant harmonics generated by the furnace arcs and by phase control of thyristors in a manner to be described hereinafter. By so tuning each harmonic filter for series resonance at a selected frequency a low impedance by pass circuit is provided for that frequency so that harmonics generated in arc furnace 20 or in the thyristor-controlled reactor IR do not enter the power circuit through the substation transformer 14. If additional shunt capacitance is required it is preferably tuned to harmonic frequencies above that of the seventh harmonic.

In order to control the compensating effect of the capacitive reactor CR an inductive shunt reactor IR is also connected across the furnace bus in parallel with the load 20. The inductive reactance IR comprises three series-connected pairs of fixed inductors 40, 40A, 41, 41A and 42, 42A connected in delta circuit relation, each arm of the delta including one pair of inductors in series with an intermediate AC thyristor switch. Specifically the inductive reactor arm 40, 40A includes an intermediate thyristor switch 40B, the arm 41, 41A includes an intermediate thyristor switch 41B and the arm 42, 42A includes an intermediate thyristor switch 42B. As is well known to those skilled in the art such thyristor switch comprises a pair of thyristors, or a pair of thyristor groups, connected in inverse parallel relation to conduct opposite half cycles of an alternating current. In the inductive reactor IR the inductors are connected in delta relation primarily in order to minimize the current requirements of the thyristors and reactors. When the system is balanced the delta connection serves also to short circuit third harmonic currents and to thus aid in eliminating them from the power lines. The third harmonic is a predominant harmonic generated by phase controlling action of single phase thyristor switches.

In the power circuit described above the capacitive compensating reactor CR and the inductive compensating reactor IR are each connected in shunt circuit relation with the arc furnace load 20 and operate in combination as a source of capacitive reactive current substantially equal in each line conductor and opposite to the inductive component of arc furnace load current traversing that line. In providing a variable net amount of leading reactive current the compensating reactors are controlled by controlling the magnitude of lagging current traversing the fixed inductors of the reactor IR, the fixed capacitors 30, 31, and 32 providing a predetermined fixed amount of leading reactive current. Phase control of inductive compensating current thus varies the apparent reactance of IR.

It will be evident to those skilled in the art that a fixed amount of capacitive compensation may be provided by capacitors in series with the line, or by a combination of series and parallel capacitors. The reactive current effect of a fixed capacitor in series with the line may be varied by connecting a fixed inductor in parallel with the capacitor through a phase-controlled thyristor.

In the apparatus illustrated in the drawing it is to be noted that when the thyristor switches 40B, 41B and 42B are completely non-conductive only the capacitive compensating reactor CR is in circuit across the load. When the thyristor switches are fully conductive the inductive reactor IR is fully effective and supplies a predetermined amount of lagging reactive current greater than, equal to or less than the amount of leading reactive current supplied by the capacitive reactor CR. Preferably, a new amount of leading reactive current supplied by the capacitive and inductive compensating reactors CR and IR together is maintained approximately equal in each line conductor to the lagging or inductive current component of furnace load current in that line under varying load conditions. When the inductive current in the load 20 is thus substantially balanced by an equal capacitive current supplied by the combination of compensating reactors CR and IR only the power or resistive component of load current appears on the furnace bus 15, 16, 17. If in addition the inductive component of line current required by the substation transformer 14 is compensated by the reactors CR and IR the entire load beyond the critical voltage bus 25, 26, 27 appears as a resistive load.

In some applications where it is desired to provide complete compensation for negative sequence components of current it is possible that the lagging component of compensating current may appreciably exceed the leading component of compensating current.

Reactive Current Supply

In order to so control the amount of inductive current traversing the compensating reactor IR I have shown a conduction angle gating control illustrated generally in block form at FIG. 1. This control comprises first means responsive to the reactive component of current in the load circuit itself for establishing and continuously resetting the conduction angle of the thyristor switches 40B, 41B and 42B so that the net reactive current supplied by the compensating reactors IR and CR is substantially equal in magnitude and opposite in phase to the reactive component of load current. The first compensation acts substantially wihout appreciable time delay and without feed-back, so that undesired bias or drift could introduce error into the compensation setting. The conduction angle control illustrated at FIG. 1 therefore additionally includes means responsive to power factor, or current angle, at the critical voltage bus 25, 26, 27 to provide a conduction angle control signal such that power factor at the critical bus is maintained substantially constant, preferably near unity. This latter control provides negative feedback through the line current and voltage sensors required and is thus a regulating control as distinguished from an open ended compensating control. So that feed-back does not attain a critical phase relation and result in signal build up and oscillation, a certain amount of time delay, or frequency attenuation, must be introduced into the control loop. Because of such time delay, or damping, the current angle regulator is slow in response compared to the load current compensating control. Both the load current compensating control and the current angle regulating control may be used separately, or the two may be used in conjunction as illustrated at FIG. 1. When used together the compensating control acts rapidly as a primary control and the delayed current angle control serves as an adjustment to prevent drift or other error.

Load Current Compensation

Figure 2:
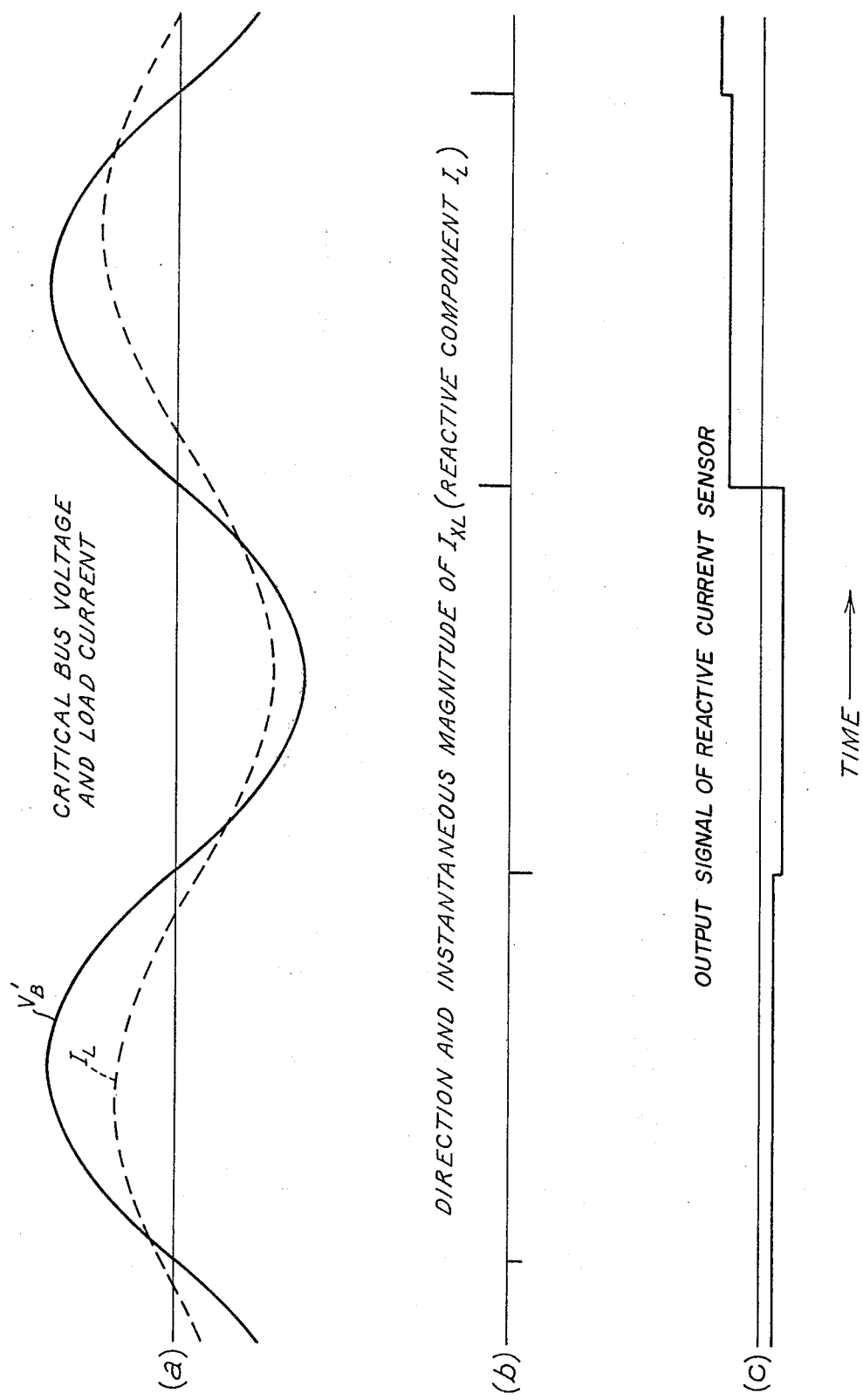
Figure 3:
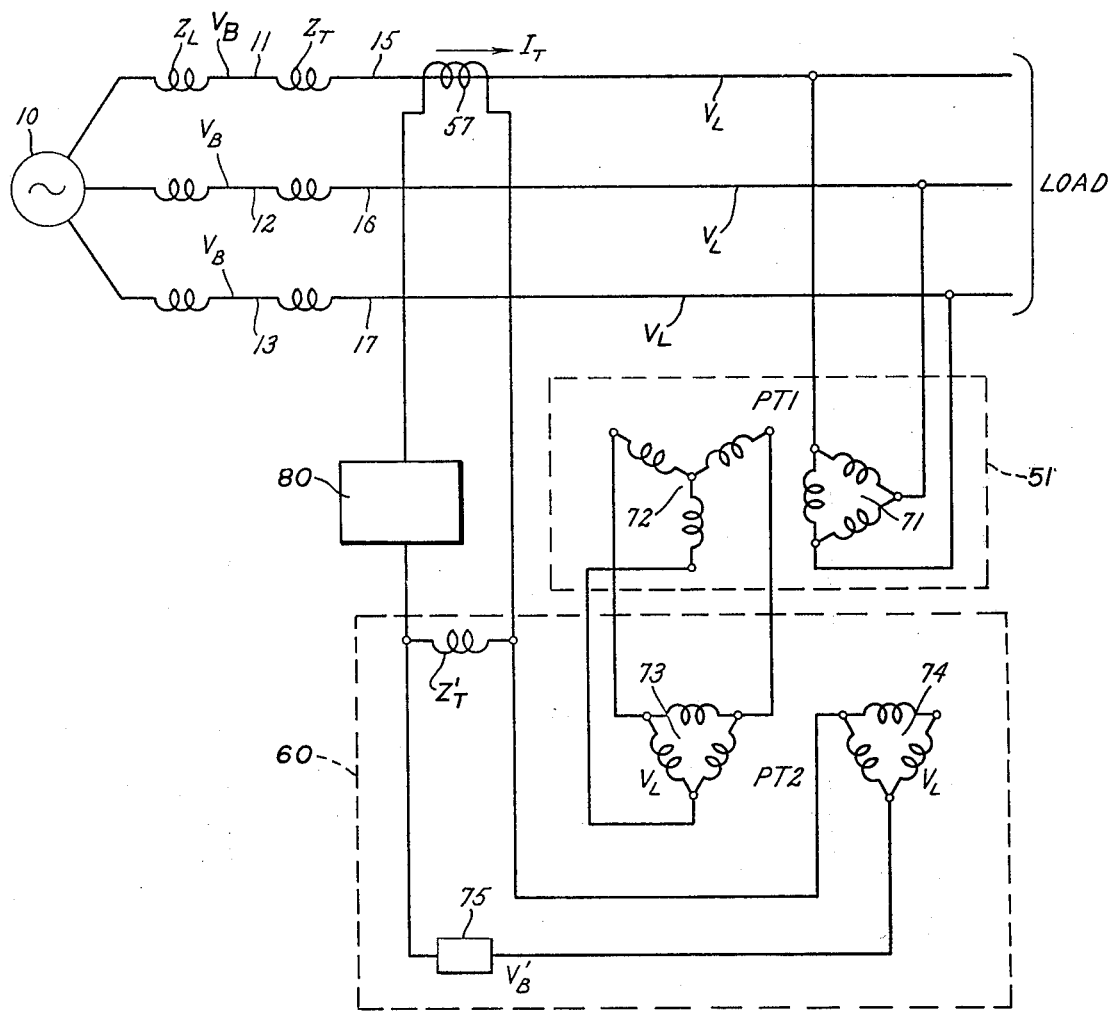

The load current compensation control illustrated at FIGS. 1, 2, 3, comprises a Reactive Current Sensor 50 receiving input signals responsive to phase voltage at the critical bus and to load current and operating in a manner illustrated at FIG. 2 to develop a variable unidirectional, or unipolarity, output signal which controls the gating angle of the trigger signals which periodically fire or turn on the thyristor switches 40B, 41B, 42B, for each instantaneous compensation requirement. In referring to a "unidirectional" or "unipolarity" output signal I means a signal having a single direction, or polarity, for any predetermined reactive current condition to be corrected, the signal direction or polarity indicating whether that reactive current is leading or lagging with respect to voltage. Thus while the signal polarity may reverse from time to time as power circuit impedance changes it is unidirectional or unipolar for any one impedance condition of the power circuit.

By "gating angle" I mean the phase angle with respect to the impressed alternating voltage wave at which each thyristor is triggered into conduction. This phase angle, as measured from the start of forward voltage impressed on the thyristor, is referred to hereinafter as the gating angle. The interval during which the thyristor subsequently conducts following each triggering is referred to hereinafter as the "conduction angle". When the conduction angle is substantially 180° for each thyristor the switch is considered to be fully "on" or closed; when the conduction angle is substantially 0° the switch is considered to be fully "off" or open. At intermediate conduction angles, and correspondingly intermediate gating angles, the switch is partially "on" and partially "off" during each half cycle and controls the amount of current flowing therethrough by the ratio of "on time" to "off time".

The phase voltage signal supplied to the Reactive Current Sensor 50 is derived in accordance with my invention from the furnace bus 15, 16, 17 through potential transformers 51 connected to the furnace bus 15, 16 and 17 at points 52, 53 and 54 respectively. By modifying the load voltage signal $V_L$ at the output of the potential transformers 51 with a line current signal derived through current transformers 55, 56 and 57 (as will be more fully described hereinafter) there is derived in a Critical Bus Voltage Projector 60 a phase voltage signal $V'_B$ representative in phase and magnitude of the line-to-neutral or phase voltage at the critical bus 25, 26, 27. This "projected" phase voltage $V'_B$ thus takes into account correction required for the reactive effect of transformer 14. The projected phase voltage $V'_B$ is supplied to the Reactive Current Sensor 50 and cooperates with the load current signal $I_L$ in a manner illustrated at FIG. 2 to generate a signal output during each half cycle of the projected phase voltage representative of the magnitude of the reactive current component in the load circuit 20. It will be understood that three such projected voltage signals $V'_B$ are derived, one for each line of the three phase power circuit.

In FIG. 2 I have shown at diagram (a) in solid lines the projected phase voltage signal $V'_B$ for one phase as supplied to the Reactive Current Sensor 50. Also on diagram (a) there appears in dotted lines a load current signal $I_L$ from the associated load conductor supplied to the Current Sensor 50 through a load current signal source 61 from one of a group of load current transformers 62, 63, 64. For the purpose of illustrating the mode of operation of the Reactive Current Sensor the current signal $I_L$ illustrated at FIG. 2(a) is shown as varying in phase with respect to the phase voltage signal $V'_B$ from an initial leading relation to a final lagging relation. The Reactive Current Sensor 50 includes suitable circuit means (not shown) for instantaneously sampling the magnitude and direction of the current signal $I_L$ at each zero crossing point of the phase voltage signal $V'_B$. These current signal samples are shown at FIG. 2(b). Finally, as shown at FIG. 2(c), the reactive current sensor 50 includes signal storage means for developing a continuous unidirectional signal output having a magnitude and direction proportional to the magnitude and direction of the last previous instantaneous sampling indicated at FIG. 2(b). Thus the signal output of the Reactive Current Sensor is an instantaneously unidirectional signal for each phase having a magnitude representative of the magnitude of reactive load current in that phase at any moment and a polarity indicative of the leading or lagging character of that load current. It will of course be understood by those skilled in the art that an instantaneous sampling of load current magnitude at the instant of phase voltage zero is a direct measure of the magnitude of the reactive component of that current with respect to the sampling voltage.

The output signals from the Reactive Current Sensor 50, each recurrently reset each half cycle at the zero crossing of phase voltage at the critical bus, represent in polarity and magnitude, respectively, the phase relation and magnitude of the reactive current required to be supplied at any instant by the compensating reactors CR and IR in order to bring total line current $I_T$ into phase with the critical bus voltage $V_B$ then existing. The leading reactive currents $I_{xc}$ through compensating reactor CR being fixed, adjustment to the desired value is carried out by controlling the average magnitude of the lagging reactive currents $I_{xl}$ traversing compensating reactor IR. The currents $I_{xl}$ are determined by the gating angles of the thyristor switches 40B, 41B, 42B. The thyristor gating angles determined by the Current Sensor 50 are so adjusted and reset on an instantaneous basis that the total reactive current $(I_{xl} + I_{xc})$ supplied by the compensating reactors IR and CR is substantially equal and opposite to the reactive component of load current $I_L$ in arc furnace 20.

To so control the gating angles of the thyristor switches the three reactive current signals from the Current Sensor 50 are supplied to a Conduction Angle Control 65 which includes a separate conduction angle control circuit for each thyristor switch, each such angle control circuit being responsive to one of the three reactive current signals. Each angle control circuit in the Conduction Angle Control 65 may be of the type described and claimed in U.S. Pat. No. 3,693,069 issued on Sept. 19, 1972 to Fred W. Kelley, Jr. and G. R. E. Lezan. The conduction angle control illustrated in U.S. Pat. No. 3,693,069, when used in conjunction with a highly inductive power circuit, exhibits some nonlinearity in thyristor output current with respect to the input signal and a dynamic response which may result in an underdamped or overdamped tendency to overshoot. Preferably therefore we utilize a conduction angle control of the type described in application Ser. No. 503,143, filed on Sept. 3, 1974 by Fred W. Kelley, Jr. and assigned to the same assignee as the present application.

If, as illustrated in FIG. 1, the reactive current control described above is utilized in combination with a current angle or power factor control to be more fully described hereinafter the output of the Reactive Current Sensor 50 is supplied to the Conduction Angle Control unit 65 through a Summation Device 66 as indicated at FIG. 1. It will of course be understood by those skilled in the art that if only one or the other control signal is used the Summation Device is not required.

It will now be understood by those skilled in the art that when the gating angles of the thyristor switches 40B, 41B, 42B are set in accordance with the output signals of the Reactive Current Sensor 50 the sum of the reactive compensating currents $I_{xl}$ and $I_{xc}$ supplied through the compensating reactors IR and CR will be substantially equal and opposite to the reactive current components required to supply the arc furnace load 20 and the substation transformer 14, so that total line current $I_T$ is maintained substantially in phase with line voltage $V_B$ at the critical bus 25, 26, 27.

It will be understood that, while at FIG. 2 load current has been shown for illustration as leading the voltage signal $V'_B$ at one point, this is an unusual condition. The reactive components of current required by both the load 20 and the transformer 14 are in fact inductive so that the net reactive compensating current supplied by the compensating reactors IR and CR ordinarily will be capacitive. It is for this reason that the fixed capacitive reactance of the capacitors 30, 31, 32 is ordinarily greater than the inductive reactance of the reactors 40, 40A, 41, 41A, 42, 42A. Thus when the thyristor switches 40B, 41B, 42B are fully conducting (i.e., apparent inductive reactance minimum) so that inductive compensating current in reactor IR is maximum such current is ordinarily at least slightly less than the capacitive compensating current in the reactor CR.

It should be noted that it is possible that the reactive component of load current in at least one line may be leading, as in an arc-out condition in one phase of an arc furnace. For full compensation of such a condition the reactor IR must be able to supply lagging currents of greater magnitude than the fixed leading currents in reactor CR.

It will be evident to those skilled in the art that, while I have shown at FIG. 2 only a single phase voltage and the load current in one line, the three phase circuit illustrated at FIGS. 1 and 3 involves three such relationships and it is contemplated that three reactive load current signals will be generated as at FIG. 2(c). These three current signals will be equal in a balanced circuit, but will be different at any instant in the case of an unbalanced load. In the case of unbalance, therefore, it will be understood that in any one half cycle the resulting gating angles are not the same in the several switches 40B, 41B, 42B. It is evident of course that by the control described these gating angles are reset each half cycle in accordance with existing load current conditions.

In order to effect the desired compensation of reactive load current in each line of a three phase power circuit the net compensating reactance provided between each pair of line conductors (by the combined effect of IR and CR) may be expressed in terms of reactive components of load current as follows:

$$X_{c(1-2)} = \frac{3E}{-I_{3LX} + I_{1LX} + I_{2LX}}$$

$$X_{c(2-3)} = \frac{3E}{-I_{1LX} + I_{2LX} + I_{3LX}}$$

$$X_{c(3-1)} = \frac{3E}{-I_{2LX} + I_{3LX} + I_{1LX}}$$

where E is the magnitude of line-to-neutral voltage at the load (designated $V_L$ above), $X_c$ is net capacitive compensating reactance between the indicated pairs of line conductors and $I_{1LX}$, $I_{2LX}$ and $I_{3LX}$ are lagging reactive components of load current in the respective load circuit conductors. It will of course be evident that if solution of these equations in any case results a negative $X_c$ the indication is that net compensating reactance should be inductive rather than capacitive.

From the foregoing relation it becomes evident that phase control of current through each of the switches 40B, 41B, 42B to determine the apparent inductive reactance in the associated branch of the compensator IR should be responsive to a summation of the all reactive load current components in the manner defined by the equations above.

It has also been established that the net compensating reactance between each pair of line conductors may be expressed in terms of both real and reactive components of load current as follows:

$$X_{c(1-2)} = \frac{E}{\left[\frac{2}{3\sqrt{3}}(I_{2LR} - I_{1LR}) + \frac{1}{9}(I_{1LX} + I_{2LX} + I_{3LX})\right]}$$

$$X_{c(2-3)} = \frac{E}{\left[\frac{2}{3\sqrt{3}}(I_{3LR} - I_{2LR}) + \frac{1}{9}(I_{1LX} + I_{2LX} + I_{3LX})\right]}$$

$$X_{c(3-1)} = \frac{E}{\left[\frac{2}{3\sqrt{3}}(I_{1LR} - I_{3LR}) + \frac{1}{9}(I_{1LX} + I_{2LX} + I_{3LX})\right]}$$

where $I_{1LR}$, $I_{2LR}$ and $I_{3LR}$ are real or in-phase components of load current in the respective load circuit conductors and the other symbols have the same meaning as in the prior set of equations.

Current Sensor 50, while designed to bring the net reactive component of total line current $I_T$ to substantially zero, does not appreciably affect the reactive component of load current to which the Reactive Current Sensor 50 is responsive. There is therefore no feed-back through the power system to indicate to the Current Sensor 50 whether or not a proper adjustment has been made. Thus if any long term drift or bias is impressed upon the Reactive Current Sensor output, or if any range or amplification error is introduced into the control circuitry between the Current Sensor output and the thyristor gates, the range of reactive current compensation may be offset and error introduced in the degree of compensation. Without feed-back to control the compensating loop such errors will not be detected. For this reason we prefer to utilize in combination with the Reactive Current Sensor a Current Angle Sensor, or phase angle regulator as described hereinafter.

Current Angle Regulation

As indicated at FIG. 1 a Current Angle Sensor 70 is provided with a line current signal from the current transformers 55, 56, 57 and with projected voltage signals, derived from total line currents $I_T$ and load phase voltages $V_L$, which represent in phase and magnitude the system phase voltages $V_B$ at the critical bus 25, 26, 27. The projected system phase voltage signals $V'_B$ derived from voltages at the furnace bus 15, 16, 17 are principal input components to both the Current Angle Sensor and the Reactive Current Sensor previously described. The manner of deriving these projected voltage signals in accordance with my invention will now be described in greater detail. For this purpose I have illustrated at FIG. 3 a simplified partial circuit diagram of the apparatus shown at FIG. 1. In the power circuit of FIG. 3 transmission line impedance is represented as a series impedance $Z_L$ in each phase and the impedance of substation transformer 14 is represented as a series impedance $Z_T$ in each phase. The system voltages $V_B$ on the conductors 11, 12 and 13 intermediate the impedances $Z_L$ and $Z_T$ are the critical bus voltages to be maintained substantially constant by maintaining an in-phase relation of the line currents $I_T$. On the load side of the impedance $Z_T$ the load voltage $V_L$ appears on the conductors 15, 16, 17.

To derive from the load phase voltages $V_L$ projected system voltage signals $V'_B$ which are representative in magnitude and in phase with the system phase voltages $V_B$, respectively, I provide a potential transformer assembly comprising two potential transformers PT1 and PT2 (FIG. 3). The potential transformer PT1 in black 51 (FIGS. 1 and 3) has a delta-connected primary winding energized from the line-to-line load voltage and a wye-connected secondary winding. On each secondary phase winding of PT1 there appears an in-phase proportional replica of line-to-line load voltage. The wy-connected secondary windings of transformer PT1 supply delta-connected primary windings 73 of a second potential transformer PT2 within the Voltage Projector 60. The secondary windings 74 of transformer PT2 are also delta-connected. It will be understood that the voltage across each phase winding of the potential transformer PT2 is an in-phase replica of the line-to-neutral or phase voltage $V_L$ at the furnace bus 15, 16, 17. To convert the output of transformer PT2 to represent in phase and magnitude the critical bus phase voltages on conductors 11, 12 and 13 it is necessary for each phase to combine this output victorially with a voltage drop that is in phase with voltage drop in the associated impedance of transformer 14 and proportional to the step-down ratio of the potential transformers 51. For this purpose I connect in circuit with each line current transformer 55, 56, 57 (only one phase of which is shown at FIG. 3) a replica impedance $Z'_T$, appropriately proportioned to the transformer impedance $Z_T$ and to the transformation ratio of potential transformers 51. As will appear hereinafter each current transformer circuit includes in series a line current signal source 80 (FIGS. 1 and 3). The voltage across one secondary winding of the transformer PT2 and the related phase impedance $Z'_T$ appears across an output impedance 75 at the terminals of which there appears the projected phase voltage signal $V'_B$. The signal $V'_B$ for each phase is an in-phase replica of the associated critical bus phase voltage $V_B$. It is these projected (and proportional) critical bus voltages which are supplied to both the Current Angle Sensor 70 and the Reactive Current Sensor previously described.

In the Current Angle Sensor 70 the projected voltage signal $V'_B$ for each phase cooperates with a total line current signal from the associated line derived from the line current transformers 55, 56, 57 through line current signal source 80 to generate a signal output representative of phase angle between line current and phase voltage $V_B$ at the critical bus. The manner in which this output signal is generated is graphically illustrated at FIG. 4. Diagram (a) of FIG. 4 shows by a solid line one projected system voltage signal $V'_B$ plotted on a time scale with its associated total line current $I_T$ shown by a dotted line. For the purpose of illustration the line current $I_T$ is shown varying in phase with respect to system voltage from an initial leading relation to a final lagging relation. It will be understood by those skilled in the art that, except at extremely light loads, a leading relationship is not likely to exist. The Current Angle Sensor includes integrating means for developing a signal representative in final magnitude to the time displacement, or phase, between the line current zero and the system phase voltage zero as illustrated at FIG. 4(a) and having a polarity indicative of leading or lagging phase relationship of current $I_L$ with respect to voltage $V'_B$. Such an integrated signal is shown at FIG. 4(b). The integrated signal thus generated at each half cycle of system voltage is supplied to a suitable signal storage means which develops a continuous output signal having at any instant a unidirectional magnitude equal to the last preceding time integration shown at FIG. 4(b) and a polarity corresponding to the polarity of the last preceding integrated signal. At FIG. 4(c) we have shown such a continuous unidirectional output signal reset in polarity and magnitude at each half cycle in accordance with the integrated signal at FIG. 4(b) and thus in accordance with the instantaneous voltage-current phase relation or current angle shown at FIG. 4(a).

The variable unidirectional output signal illustrated at FIG. 4(c) is supplied from the Current Angle Sensor 70 to the Summation Device 66 through a suitable Stabilizing Circuit 85 which interposes a time constant in the control loop for a purpose described hereinafter. In the Summation Device 66 this unidirectional current angle signal is combined by addition with the unidirectional reactive load current signal from the Current Sensor 50 thereby to so adjust the output of the Summation Device that the Conduction Angle Control 65 is regulated to maintain power factor at the critical bus substantially constant, preferably at unity. If a power factor other than unity is desired a positive or negative bias signal of appropriate magnitude may be supplied to the Summation Device 66.

It may now be noted that the current angle control inherently provides negative feed-back through the power system conductors. Specifically, any current angle signals generated so control the thyristor gating angles and thus the net reactive compensating current that line current $I_T$ is restored to or near the desired phase relation thereby substantially to eliminate the current angle signal. It is because of this feed-back that the Stabilizing Circuit 85 is desirable. Because the control circuits inherently possess a time constant characteristic the imposition of any change in the control signal is transmitted through the control circuits to the thyristors and thence back through the power system with a time characteristic. The rate of change established by such time characteristic identifies a frequency. If the inherent time constant in the control and the feed-back loop were such that inherent delay in terms of this frequency were 180° in respect to the time characteristic frequency, the feed-back, desirably negative, would become positive and thus cause amplification and oscillation. To preclude this effect the Stabilizing Circuit 85 adds sufficient time constant to the control loop that the oscillation is inhibited. On the other hand, because of this delay in signal transmission through the current angle control loop this control is not as rapid as might be desired; if used alone response of the compensating reactor IR would be appreciably delayed. When the current angle regulation is used with the load current compensator, however, the current angle signal is normally quite small and acts only as a correction for any inaccuracy of the open-loop load current control.

Adjustable Limit Feed-Back

In some cases the instantaneous peak of reactive compensating current demand may exceed the maximum capability, or rating, of the compensating reactors IR while the amplitude of variations in demand are within the capability of the reactors IR.

If desired therefore reactive current compensating apparatus of the type illustrated may be provided with means for limiting to some predetermined maximum average value the magnitude of reactive current, or reactive volt-amperes, supplied by the compensating reactors IR and CR. Since the capacitive compensating reactor CR provides a constant amount of leading reactive current this control is applied to the inductive compensating reactor IR. For this purpose I provide an Adjustable Limiting Feed-Back circuit 90 which receives its output of the Summation Device 66 and supplies through a stabilizing circuit 91 a limiting negative feedback signal to the input of the Summation Device 66. Stabilizing circuit has a time constant which is long in relation to cycle time of the six cycle arc furnace characteristic refered to hereinbefore. The effect of this limiting feedback circuit is illustrated at FIG. 6.

Figure 6:
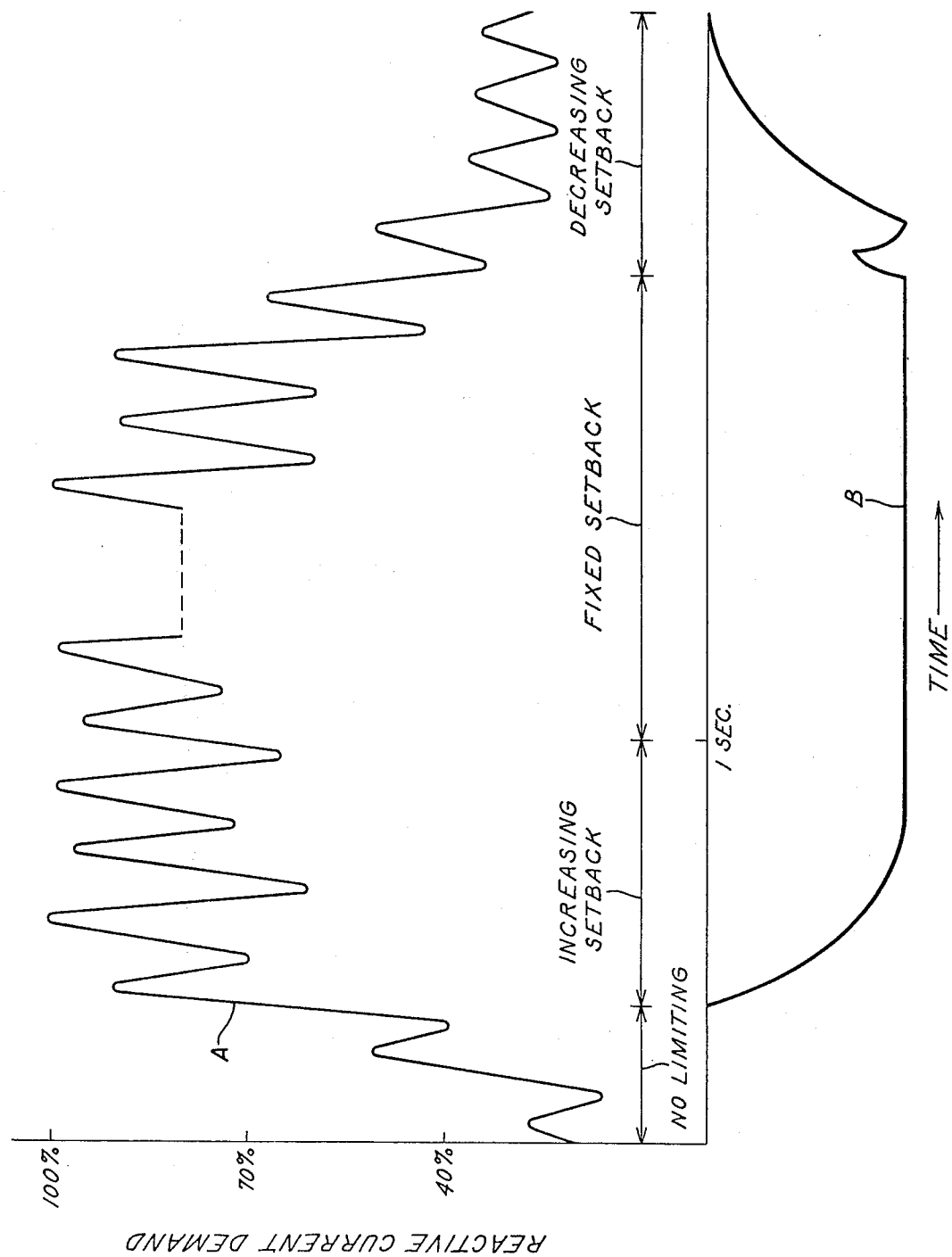

At FIG. 6 I have illustrated on a horizontal time scale a typical oscillatory demand characteristic A of arc furnace reactive current over an illustrative time interval, as while a fresh furnace charge is being melted and reduced to relatively steady state condition. Due to the physical characteristics of the furnace and the arc this oscillatory demand curve typically has a frequency of the order of 6 cycles per second. The ordinate of the curve represents reactive current demand of the furnace on a scale of percentage where 100% represents maximum demand. If it is desired to limit maximum compensating reactive current to less than maximum demand, as for example to 70% of maximum demand, somewhat less than full compensation will be attained under limiting conditions so that power factor at the critical bus will be maintained substantially constant during operation of the limiter but at some predetermined value less than unity. This may be desirable in order to limit the size and power capacity of the compensating inductors IR and CR and is not objectionable within reasonable limits. A relatively small degradation in power factor at the critical bus permits a small and tolerable degree of voltage regulation. Moreover, if the degraded power factor is maintained substantially constant over a time period large in relation to the cycle time of the demand curve A at FIG. 6 voltage flicker is still largely eliminated.

Figure 5:
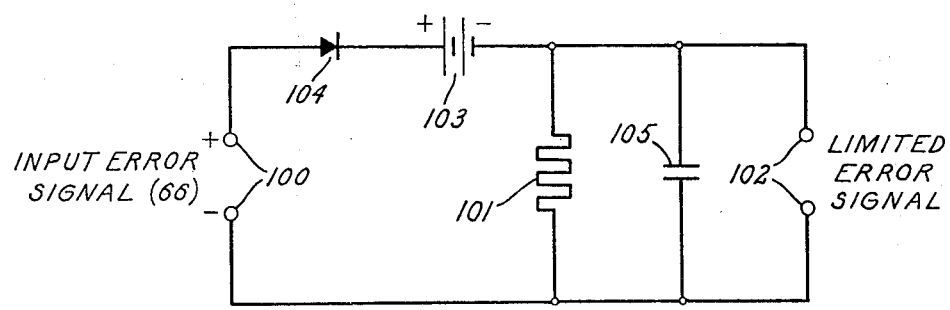

At FIG. 5 I have shown a simple illustration of a limiting feed-back circuit adapted to accomplish the purpose described above. In FIG. 5 the integrated error signal from the output of the Summation Circuit 66 (FIG. 1) is applied at a pair of input terminals 100 with the polarity indicated and an output impedance 101 between output terminals 102 is connected in series with a battery 103 and a blocking diode 104 across the input terminals 100. The battery 103 is connected in opposing relation with the error signal at the terminals 100 so that no current flows through the blocking diode 104 or the limiting circuit until the error signal exceeds a predetermined amount slightly greater than the reverse bias of the battery 103. When the error signal exceeds such biasing voltage current flows through the diode 104 and the output impedance 101. So long as the diode 104 conducts the battery 103 applies a constant reverse bias or set back to the input error signal and thus reduces the output error signal at terminals 102 by the amount of this bias. A long time constant capacitor 105 across the output terminals 102 maintains the output error signal on the terminals 102 for at least several cycles of furnace demand variation so that momentary reductions of the input error signal below bias voltage will not recurrently interrupt the feedback. The capacitor 105 in conjunction with resistor 101 serves as the stabilizing circuit 91 of FIG. 1 and imposes a long time constant upon the feed-back signal, i.e., of the order of at least several times the cycle time of the furnace demand frequency.

At FIG. 6 I have shown the foregoing bias or set back signal as a curve B. This curve B represents the limiting feed-back signal and thus the consequent magnitude of set back in reactive compensating current with respect to the reactive current demand of the load. The resulting limited error signal supplied to the Conduction Angle Control 65, therefore, is a signal equal to the sum of curves A and B at FIG. 6.

While I have illustrated a preferred embodiment of our invention by way of illustration, many modifications will occur to those skilled in the art and I therefore wish to have it understood that I intend in the appended claims to cover all such modifications as fall within the true spirit and scope of my invention.

What I claim as new and desire to secure by Letters Patent of the Unites States is:

1. In voltage measuring apparatus for a three conductor three phase electric transmission line including reactive impedance between a measuring location and a remote point, transformer means for deriving from the three transmission line conductors at said measuring location a first voltage signal having the phase position of line-to-neutral voltage on at least one phase conductor of said transmission line at said measuring location, a reactive replica impedance proportional to said reactive impedance in the phase associated with said phase conductor, means responsive to line current in said phase conductor for developing across said replica impedance a second voltage signal proportional in phase and magnitude to the voltage drop in the said reactive impedance in such phase, and means for adding said first and second voltage signals to derive a resultant projected voltage signal having the phase position of line-to-neutral voltage at said remote point.

2. Voltage measuring apparatus according to claim 1 wherein said transformer means comprises delta connected three phase primary windings connected to the three transmission line conductors at said measuring location, wye connected three phase secondary windings inductively associated with said primary windings, and means utilizing the line terminals of said secondary winding to derive said first voltage signal.

* * * * *